United States Patent
Chang et al.

(10) Patent No.: US 8,236,484 B2
(45) Date of Patent: Aug. 7, 2012

(54) SINGLE LAYER RESIST LIFTOFF PROCESS FOR NANO TRACK WIDTH

(75) Inventors: Jei-Wei Chang, Cupertino, CA (US); Chao-Peng Chen, Fremont, CA (US); Chunping Luo, Milpitas, CA (US); Shou-Chen Kao, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 1674 days.

(21) Appl. No.: 10/714,305

(22) Filed: Nov. 14, 2003

(65) Prior Publication Data

US 2005/0106509 A1   May 19, 2005

(51) Int. Cl.
*G03F 7/40* (2006.01)
(52) U.S. Cl. ......... 430/328; 430/329; 430/330; 430/315
(58) Field of Classification Search .................. None
See application file for complete search history.

(56) References Cited

U.S. PATENT DOCUMENTS

| | | | |
|---|---|---|---|
| 4,904,619 A * | 2/1990 | Yamada et al. | 438/2 |
| 5,212,044 A | 5/1993 | Liang et al. | 430/192 |
| 5,512,334 A * | 4/1996 | Leuschner et al. | 427/558 |
| 6,383,944 B1 * | 5/2002 | Furihata et al. | 438/725 |
| 6,519,124 B1 | 2/2003 | Redon et al. | 360/324.2 |
| 6,833,234 B1 * | 12/2004 | Bloomstein et al. | 430/321 |
| 2002/0001957 A1 * | 1/2002 | Kim et al. | 438/694 |
| 2004/0018742 A1 * | 1/2004 | He et al. | 438/710 |

* cited by examiner

*Primary Examiner* — Daborah Chacko Davis
(74) *Attorney, Agent, or Firm* — Saile Ackerman LLC; Stephen B. Ackerman

(57) ABSTRACT

As the critical dimensions of liftoff patterns grow smaller, it becomes increasingly more difficult to make liftoff resists that have the required resolution. This problem has been overcome by use of a combination of ion beam processing and ozone slimming to form lift-off patterns with undercuts from a single layer of photoresist. The ion beam process serves to harden the top portion of the resist while the ozone is used to oxidize and erode the lower portion resist sidewall to form the undercut.

8 Claims, 5 Drawing Sheets

SINGLE LAYER RESIST LIFTOFF PROCESS FOR NANO TRACK WIDTH

FIELD OF THE INVENTION

The invention relates to the general field of photolithography with particular reference to liftoff processes and their application to the formation of magnetic read heads.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a seed layer on which is an antiferromagnetic layer whose purpose is to act as a pinning agent for a magnetically pinned layer. Next is a copper spacer layer on which is a low coercivity (free) ferromagnetic layer. A contacting layer lies atop the free layer. When the free layer is exposed to an external magnetic field, the direction of its magnetization is free to rotate according to the direction of the external field. After the external field is removed, the magnetization of the free layer will stay in a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 8-20%.

Most GMR devices have been designed so as to measure the resistance of the free layer for current flowing parallel to its two surfaces. However, as the quest for ever greater densities has progressed, devices that measure current flowing perpendicular to the plane (CPP) have also been developed.

A related device to the CPP GMR described above is the magnetic tunneling junction (MTJ) in which the layer that separates the free and pinned layers is a non-magnetic insulator, such as alumina or silica. Its thickness needs to be such that it will transmit a significant tunneling current. The principle governing the operation of the MTJ cell in magnetic RAMs is the change of resistivity of the tunnel junction between two ferromagnetic layers. When the magnetizations of the pinned and free layers are in opposite directions, the tunneling resistance increases due to a reduction in the tunneling probability. The change of resistance is typically 40%, which is much larger than for GMR devices.

To fabricate GMR or MTJ read heads, liftoff technology is commonly used as part of the process, particularly at the step where the readable track width gets defined. Liftoff masks of the prior art are formed out of two distinct and separately deposited layers. Both layers are photo-sensitive but the lower layer is readily removed by one or more solvents (that do not react with other materials present) while the upper layer is resistant to chemical attack.

As the critical dimensions of liftoff patterns grow smaller, it becomes increasingly difficult to make liftoff resists that have the required resolution. A conventional single layer resist cannot be used for liftoff because it is necessary for the upper (etch resistant) layer to overhang the lower (easily etched) layer. Without such overhang, coating of the resist sidewalls by deposited material cannot be avoided so selective removal of the lower layer becomes difficult or impossible.

As track-widths decrease to less than 100 nm, the amount of undercut becomes a large fraction of the total pattern width, making the resist structure mechanically unstable and liable to collapse. Production of a small amount of undercut by a developer solvent becomes very difficult to control. As a result, the use of dual-layer resists for lift-off are becoming impractical as track-widths continue to decrease.

The present invention discloses a method of liftoff based on the use of a single layer of resist.

A routine search of the prior art was performed with the following references of interest being found:

In U.S. Pat. No. 6,519,124, Redon et al. disclose a conventional lift-off resist process while in U.S. Pat. No. 5,212,044 Liang et al. describe a method of hardening a resist using an ion beam.

SUMMARY OF THE INVENTION

It has been an object of at least one embodiment of the present invention to provide a magnetic read head having very narrow track width read capability.

Another object of at least one embodiment of the present invention has been that said read head be of either the CPP or CIP types.

Still another object of at least one embodiment of the present invention has been to provide a process, that includes photoresist liftoff, to manufacture said read head.

A further object of at least one embodiment of the present invention has been that said included liftoff process require the deposition of only a single layer of photoresist.

These objects have been achieved by use of a combination of ion beam processing and ozone slimming to form lift-off patterns with undercuts from a single layer of photoresist. The ion beam process is used to harden the resist top portion and then the ozone is used to oxidize and erode the resist sidewall to form the undercut.

DESCRIPTION OF THE PREFERRED EMBODIMENTS

The essential novel feature of the present invention is the combination of ion beam processing with ozone slimming to form lift-off patterns with undercuts. The ion beam process is used to harden the resist top portion and then the ozone is used to oxidize and erode resist sidewall to form an undercut.

When an ion beam is vertically irradiating, heat will be generated and accumulated in the top portion of a resist pattern. This local heating promotes a cross-linking reaction and thereby hardens the resist. Since the ion beam irradiates anisotropically, only the top portion of the resist is hardened while its sidewalls are not affected. The ion beam energy must be reduced to be below a threshold value so that the ion bombardment will not cause sputter etching of the resist.

When ozone gas is applied to the wafer surface, it can oxidize the resist at elevated temperatures. Such oxidation takes place at the resist surface and its rate depends on the degree of polymer cross-linking present. Since top portion of the resist feature is highly cross-linked, ozone will etch faster at the sidewall but more slowly at the top of the resist. Thus the amount of undercut can be precisely controlled by the time used for the oxidation process. The resulting process provides a resist feature, with undercut, that can be applied in the manufacturing of CIP, CPP, and TMR-GMR heads.

Figure 1:
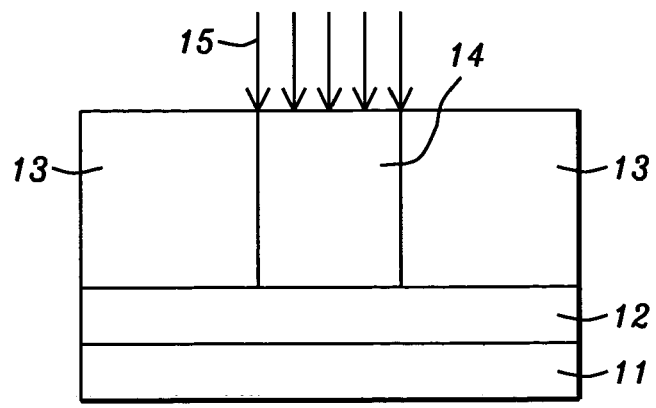
FIG. 1 shows formation of a photoresist pattern on a CPP layer.
Figure 2:
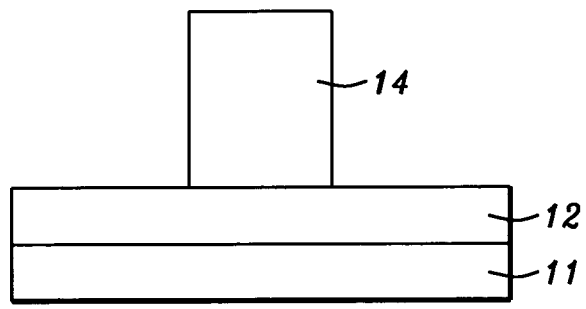
FIG. 2 is FIG. 1 following development.

We now provide a more detailed description of the process of the present invention. Referring now to FIG. 1, the process for fabricating a CPP read head (GMR or MTJ) begins with the provision of a substrate which is lower conducting lead 11 of the device. This is followed by the formation of CPP read stack 12 (GMR or MTJ with a thickness between about 200 and 650 Angstroms) on lower conducting lead 11 and then photoresist layer 13 is deposited, exposed (pattern defining image from light 15), and developed, to produce photoresist pattern 14 (as shown in FIG. 2) which will define the size of the finished CPP stack. Photoresist 14 is deposited to a thickness between about 0.1 and 0.4 microns.

Figure 3:
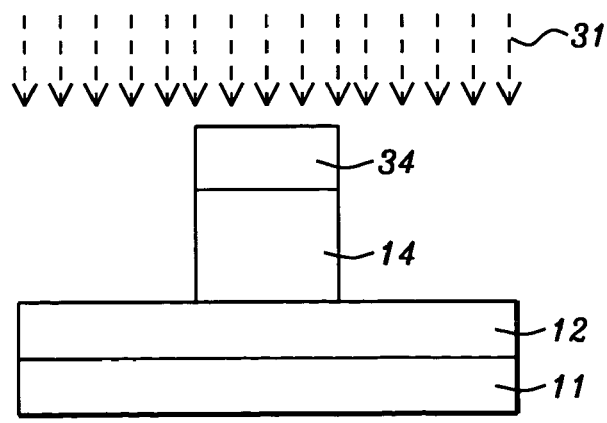
FIG. 3 illustrates the formation of a radiation hardened upper portion.

Now follows a key feature of the invention. As illustrated in FIG. 3, the upper surface of photoresist pattern 14 is irradiated with ion beam 31 that is directed to be parallel to the sidewalls. The energies of the ions in beam 31 are kept at, or below, the sputtering threshold of the resist (between about 50 and 120 volts for argon gas and between about 70 and 150 volts for Xenon gas).

Ion beam 31 is maintaining for between about 5 and 20 minutes which is sufficient time for hardened layer 34 to form to a depth of between about 100 and 500 Angstroms. All remaining photoresist 14 remains unhardened.

Figure 4:
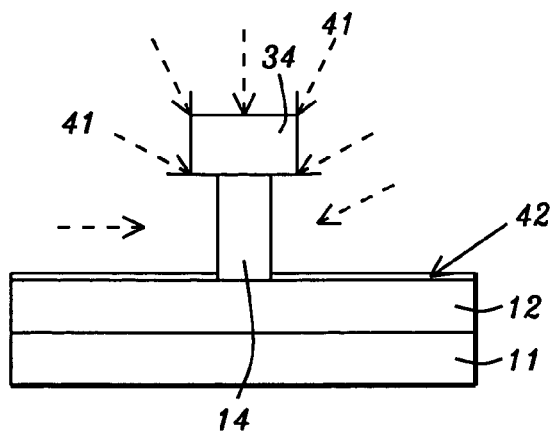
FIG. 4 illustrates the ozone-driven process used to 'slim down' the unhardened portion of the photoresist pattern.

FIG. 4 schematically illustrates another key novel step now which is to expose the photoresist pattern to ozone 41 which causes erosion of the sidewalls while leaving hardened layer 34 unchanged. This leads to a 'slimming down' of the unhardened portion 14 so that hardened layer 34 now overhangs unhardened layer 14 by between about 0.01 and 0.1 microns on each side. Exposing the photoresist pattern to ozone was achieved by placing the wafers in an ozone chamber and heating them on a hot plate to between 70 and 150° C. The ozone concentration was between 10 to 200 $gm/m^3$ at an ozone flow rate of 1 to 100 L/min. for between 1 to 60 minutes. A byproduct of the ozone treatment is the formation of oxide layer 42 on the surface of stack 12.

Figure 5:
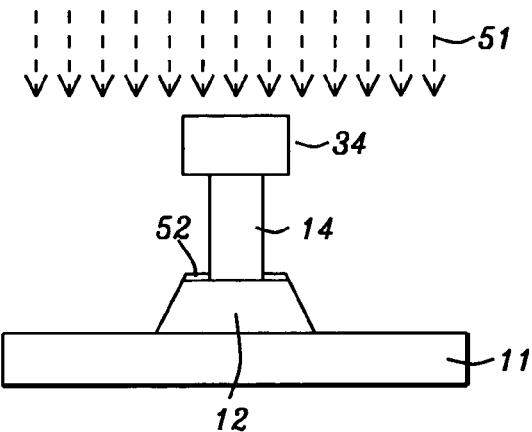
FIG. 5 illustrates the ion milling step used to shape the CPP stack.
Figure 6:
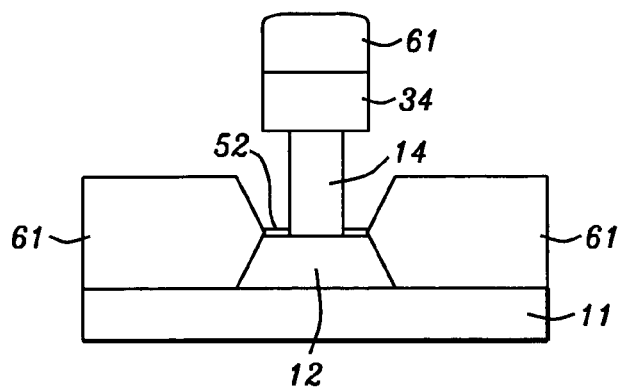
FIGS. 6 and 7 illustrate the liftoff process.

Referring now to FIG. 5, all of CPP read stack 12, that does not lie directly beneath hardened layer 34, is removed by means of ion milling 51 down to the level of conducting lead 11, giving the read stack the appearance illustrated in FIG. 5. Dielectric layer 52 (a segment of layer 42) is then deposited followed by dielectric layer 61, as shown in FIG. 6, care being taken to ensure that some amount of unhardened photoresist 14 remains uncovered so that it can be accessed later by a solvent (see next step).

Figure 7:
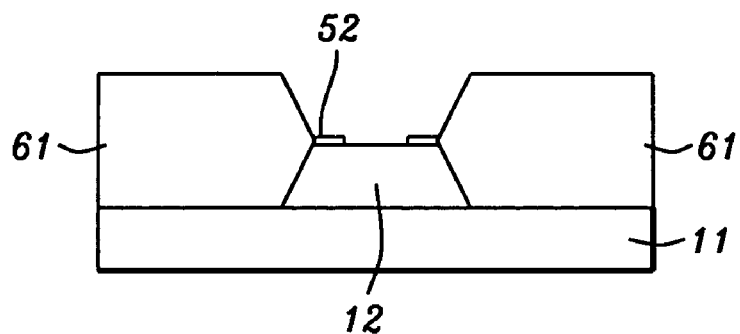

Then, as illustrated in FIG. 7, a suitable solvent is used to selectively remove unhardened photoresist layer 14 so that those parts of bias and dielectric layers 52 and 61 that contact hardened photoresist layer 34 are lifted off. The selective removal of unhardened photoresist layer 14 was achieved by using N-methyl-2-pyrrolidone at a temperature between 50 and 90° C. for 30 to 60 minutes.

Figure 8:
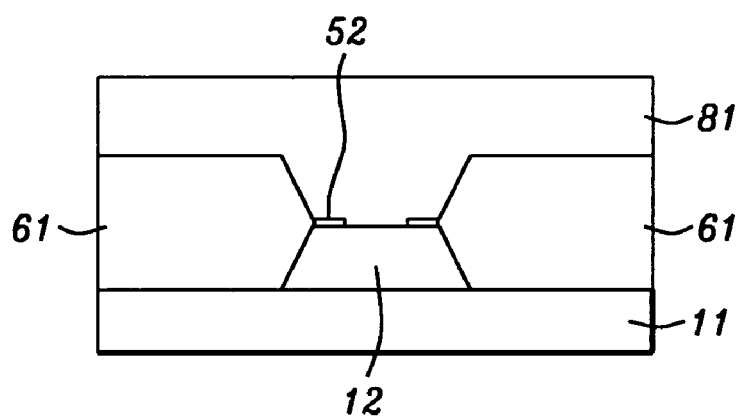
FIG. 8 shows the completed CPP device.

The process concludes with the deposition of upper conductive lead 81, onto all exposed surfaces, as shown in FIG. 8.

Figure 9:
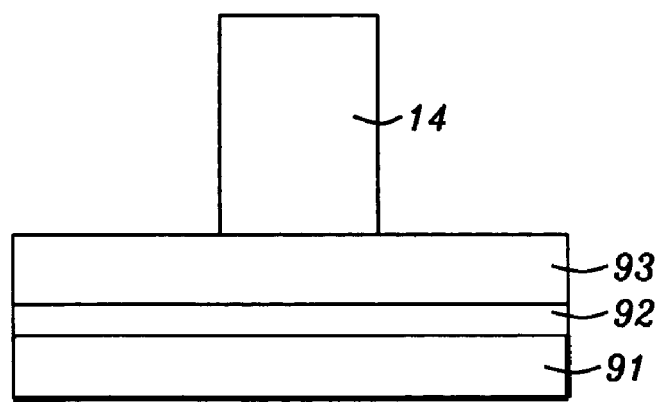
FIGS. 9 and 10 show modification of the photoresist on a CIP structure.

The process for manufacturing a CIP device is mostly similar to what was described above for CPP devices but with some key differences. The starting point, as shown in FIG. 9, is a substrate made up of dielectric gap layer 92 that has been deposited onto bottom magnetic shield 91. CIP stack 93 (a GMR device between about 200 and 450 Angstroms thick) is deposited onto dielectric 92 and then area-defining photoresist pattern 14 is laid down.

Figure 10:
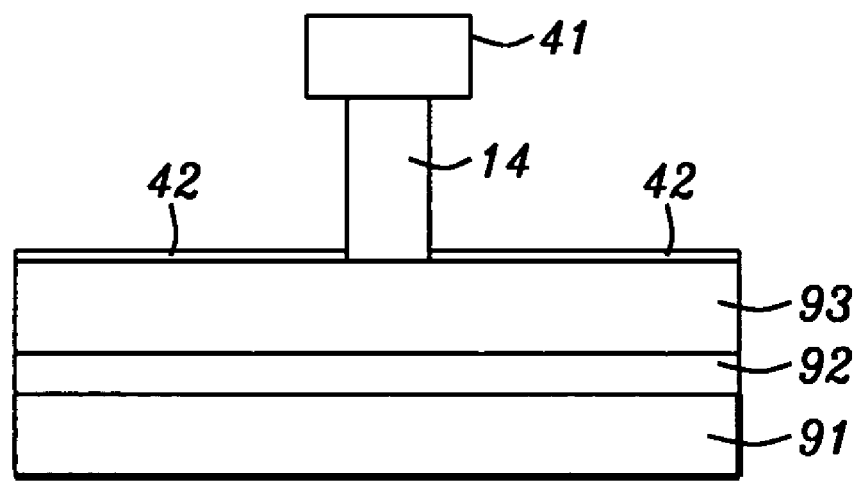
Figure 11:
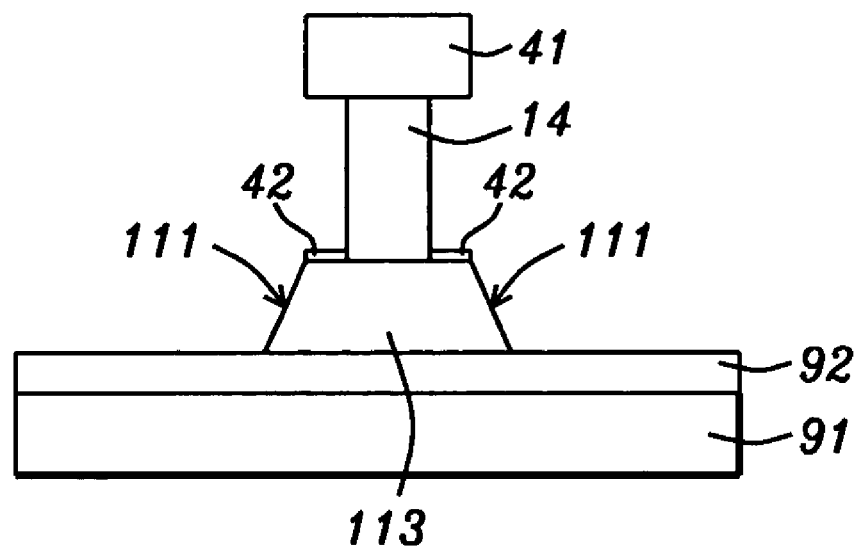
FIG. 11 shows use of ion milling to form the CIP stack, including sloping sidewalls.

Hardened photoresist portion 41, that overhangs unhardened portion 14 is formed in the same manner as was described for CPP structures. As before, oxidized layer 42 is formed as a byproduct of the plasma 'slimming' treatment (see FIG. 10). Also in a similar manner to that described above (see FIG. 11), ion beam milling is used to give the CIP stack 113 its final dimensions with a key difference that the ion milling process is adjusted to give the CIP GMR stack sloping sidewalls 111.

Figure 12:
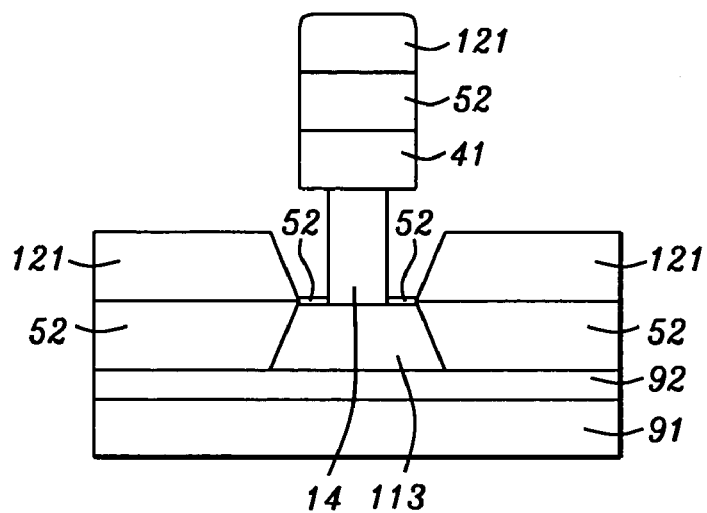
FIGS. 12 and 13 illustrate the liftoff process for the CIP case.
Figure 13:
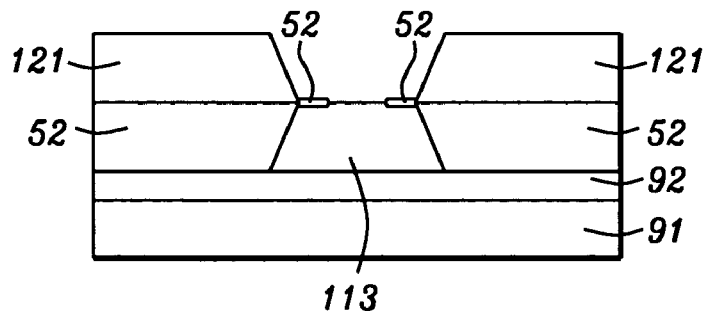
Figure 14:
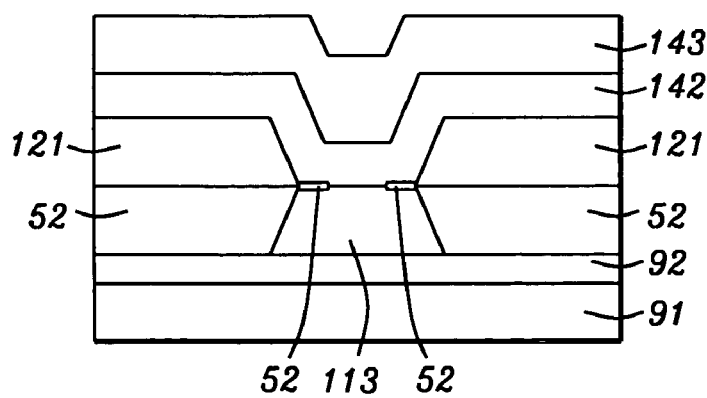
FIG. 14 shows the completed CIP device.

Following the deposition of dielectric layer 52 and conductive lead layer 121 (see FIG. 12), liftoff is achieved in the same manner as described earlier, giving the structure the appearance shown in FIG. 13. The process concludes with the deposition of dielectric gap layer 142 and top magnetic shield 143.

What is claimed is:

1. A liftoff method for photolithography, comprising:

depositing a single layer of photoresist on a substrate;

exposing and developing said photoresist layer thereby forming a photoresist pattern having sidewalls and an upper surface;

irradiating said upper surface with an ion beam having a direction parallel to said sidewalls, said ion beam comprising ions whose energy is too low to sputter said layer of photoresist;

maintaining said ion beam irradiation for a time period whereby a hardened layer is formed that extends a distance downwards from said upper surface, all remaining photoresist being unhardened;

then exposing said photoresist pattern to ozone whereby said sidewalls are eroded and said hardened layer is unchanged so that the hardened layer overhangs the unhardened layer;

depositing a layer of a material onto all horizontal surfaces to a thickness that is less than that of said unhardened photoresist layer; and selectively removing said unhardened photoresist layer whereby all of said material that is deposited onto said hardened photoresist layer is lifted off.

2. The liftoff method recited in claim 1 wherein said layer of photoresist is a negative resist or a positive resist.

3. The liftoff method recited in claim 1 wherein said layer of photoresist is deposited to a thickness between about 0.1 and 0.4 microns.

4. The liftoff method recited in claim 1 wherein said time period for which said ion beam irradiation is maintained is between about 2 and 20 minutes.

5. The liftoff method recited in claim 1 wherein said distance for which said hardened layer extends downwards is between about 100 and 500 Angstroms.

6. The liftoff method recited in claim 1 wherein the step of exposing said photoresist pattern to ozone further comprises placing the wafers in an ozone chamber, heating them to between 70 and 150° C. at an ozone concentration of between 10 to 200 gm/m$^3$ at an ozone flow rate of 1 to 100 L/minute for between 1 and 60 minutes.

7. The liftoff method recited in claim 1 wherein said hardened layer overhangs the unhardened layer by between about 0.01 and 0.1 microns on each side.

8. The liftoff method recited in claim 1 wherein the step of selectively removing said unhardened photoresist layer further comprises using N-methyl-2-pyrrolidone at a temperature between 50 and 90° C. for 30 to 60 minutes.

\* \* \* \* \*